(12) United States Patent
Saputra et al.

(10) Patent No.: US 12,040,817 B2
(45) Date of Patent: Jul. 16, 2024

(54) RESISTOR NETWORK WITH ADAPTIVE RESISTANCE FOR DIGITAL-TO-ANALOG CONVERTER (DAC)

(71) Applicant: QUALCOMM Incorporated, San Diego, CA (US)

(72) Inventors: Nitz Saputra, Burlingame, CA (US); Ashok Swaminathan, Cardiff, CA (US)

(73) Assignee: QUALCOMM Incorporated, San Diego, CA (US)

( * ) Notice: Subject to any disclaimer, the term of this patent is extended or adjusted under 35 U.S.C. 154(b) by 172 days.

(21) Appl. No.: 17/659,531

(22) Filed: Apr. 18, 2022

(65) Prior Publication Data

US 2023/0336187 A1 Oct. 19, 2023

(51) Int. Cl.
*H03M 1/78* (2006.01)
*H03K 17/687* (2006.01)
*H03M 1/76* (2006.01)

(52) U.S. Cl.
CPC .......... *H03M 1/785* (2013.01); *H03K 17/687* (2013.01); *H03M 1/76* (2013.01)

(58) Field of Classification Search
CPC ......... H03M 1/785; H03M 1/76; H03K 7/687
USPC .................................................. 341/144, 154
See application file for complete search history.

(56) References Cited

U.S. PATENT DOCUMENTS

| | | | |
|---|---|---|---|
| 5,936,563 A * | 8/1999 | Nakamura | H03M 1/66 341/144 |
| 10,581,450 B1 * | 3/2020 | Farley | H03F 3/45188 |
| 2008/0024343 A1 | 1/2008 | Rose et al. | |
| 2015/0372657 A1 | 12/2015 | Bianchi | |
| 2021/0091784 A1 | 3/2021 | Tseng et al. | |

FOREIGN PATENT DOCUMENTS

EP 2599219 B1 6/2021

OTHER PUBLICATIONS

International Search Report and Written Opinion—PCT/US2023/064748—ISA/EPO—Aug. 23, 2023.

* cited by examiner

*Primary Examiner* — Peguy Jean Pierre
(74) *Attorney, Agent, or Firm* — Patterson & Sheridan LLP

(57) ABSTRACT

Methods and apparatus for adaptively adjusting a resistance of a resistor network in a digital-to-analog converter (DAC), such as a current-steering DAC for a transmit chain. An example DAC generally includes a plurality of DAC cells. One or more of the DAC cells generally includes a current source and a resistor network. The resistor network includes a plurality of resistive elements, has an adjustable resistance, and is coupled between a power supply rail and the current source. In this manner, the DAC may support a wide range of full-scale currents, while maintaining a higher degeneration voltage and reduced noise and mismatch for a given headroom. For certain aspects, the one or more of the DAC cells further include a plurality of switches (e.g., implemented with PFETs) coupled to one or more of the resistive elements and configured to adjust the resistance of the resistor network.

20 Claims, 9 Drawing Sheets

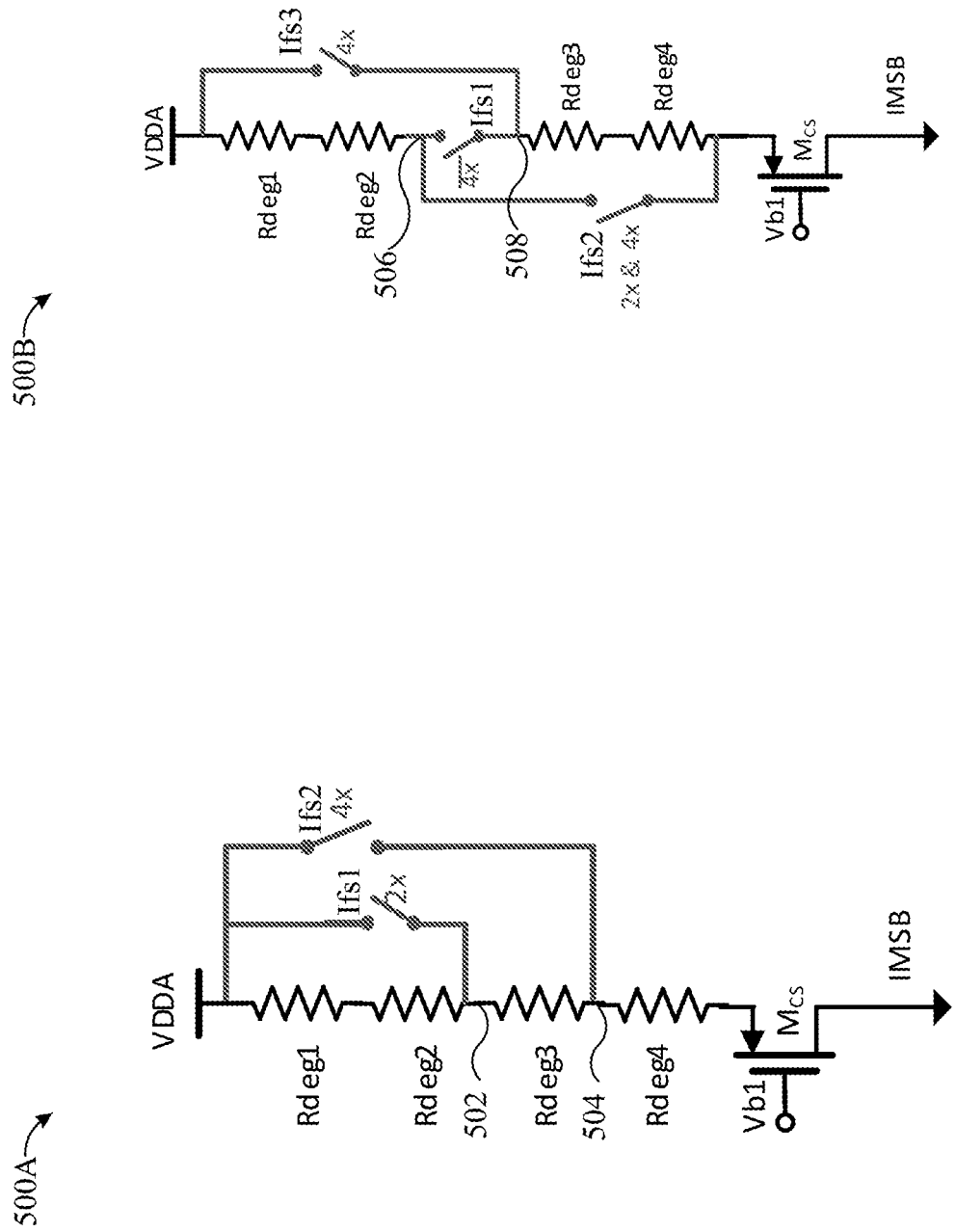

RESISTOR NETWORK WITH ADAPTIVE RESISTANCE FOR DIGITAL-TO-ANALOG CONVERTER (DAC)

TECHNICAL FIELD

Certain aspects of the present disclosure generally relate to electronic circuits and, more particularly, to digital-to-analog converters (DACs).

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, Fifth Generation (5G) New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include a transmission digital-to-analog converter (TxDAC), which may be used, for example, to convert a digital signal to an analog signal for signal processing (e.g., filtering, upconverting, and amplifying) before transmission by one or more antennas.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include improved full-scale current scaling in a digital-to-analog converter (DAC) while maintaining a maximized (or at least relatively high) degeneration voltage, which may result in reduced output noise and mismatch.

Certain aspects of the present disclosure provide a DAC. The DAC generally includes a plurality of DAC cells. One or more of the DAC cells generally include a current source and a resistor network comprising a plurality of resistive elements. The resistor network has an adjustable resistance and is coupled between a power supply rail and the current source.

Certain aspects of the present disclosure provide a wireless device. The wireless device includes the DAC as described herein, one or more antennas, and one or more transmit paths coupled between one or more outputs of the DAC and the one or more antennas.

Certain aspects of the present disclosure provide a method of digital-to-analog conversion. The method generally includes receiving a digital input code at an input of a DAC comprising a plurality of DAC cells, and generating, via the DAC, an analog output signal based on the digital input code. One or more of the plurality of DAC cells generally include a current source and a resistor network comprising a plurality of resistive elements. The resistor network has an adjustable resistance and is coupled between a power supply rail and the current source.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIGS. 5A, 5B, 5C, and 5D are schematic diagrams illustrating alternative example circuits for implementing an adjustable resistor network in a DAC, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to techniques and apparatus for digital-to-analog conversion, such as a digital-to-analog converter (DAC) with an adjustable resistor network. The adjustable resistor network may allow the voltage drop across the resistor network to be set to a desired voltage based on different full-scale currents (as set by a bias current) of the DAC.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
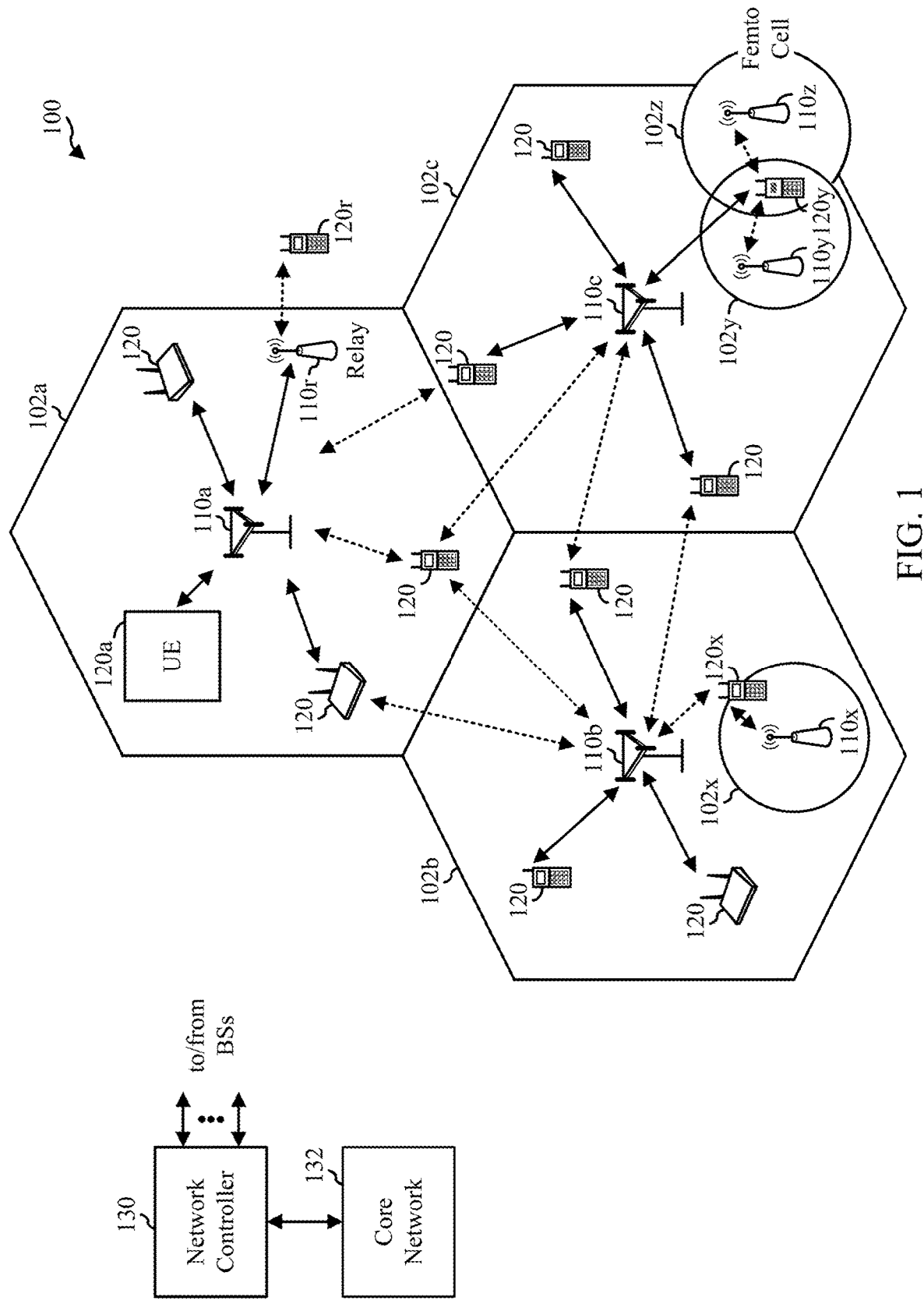
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS 110. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. ABS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number Nap of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receives user-specific data from the BSs 110. In general, each UE 120 may be equipped with one or multiple antennas. The $N_u$ UEs 120 can have the same or different number of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a digital-to-analog converter (DAC) with an adjustable resistor network, as described in more detail herein.

Figure 2:
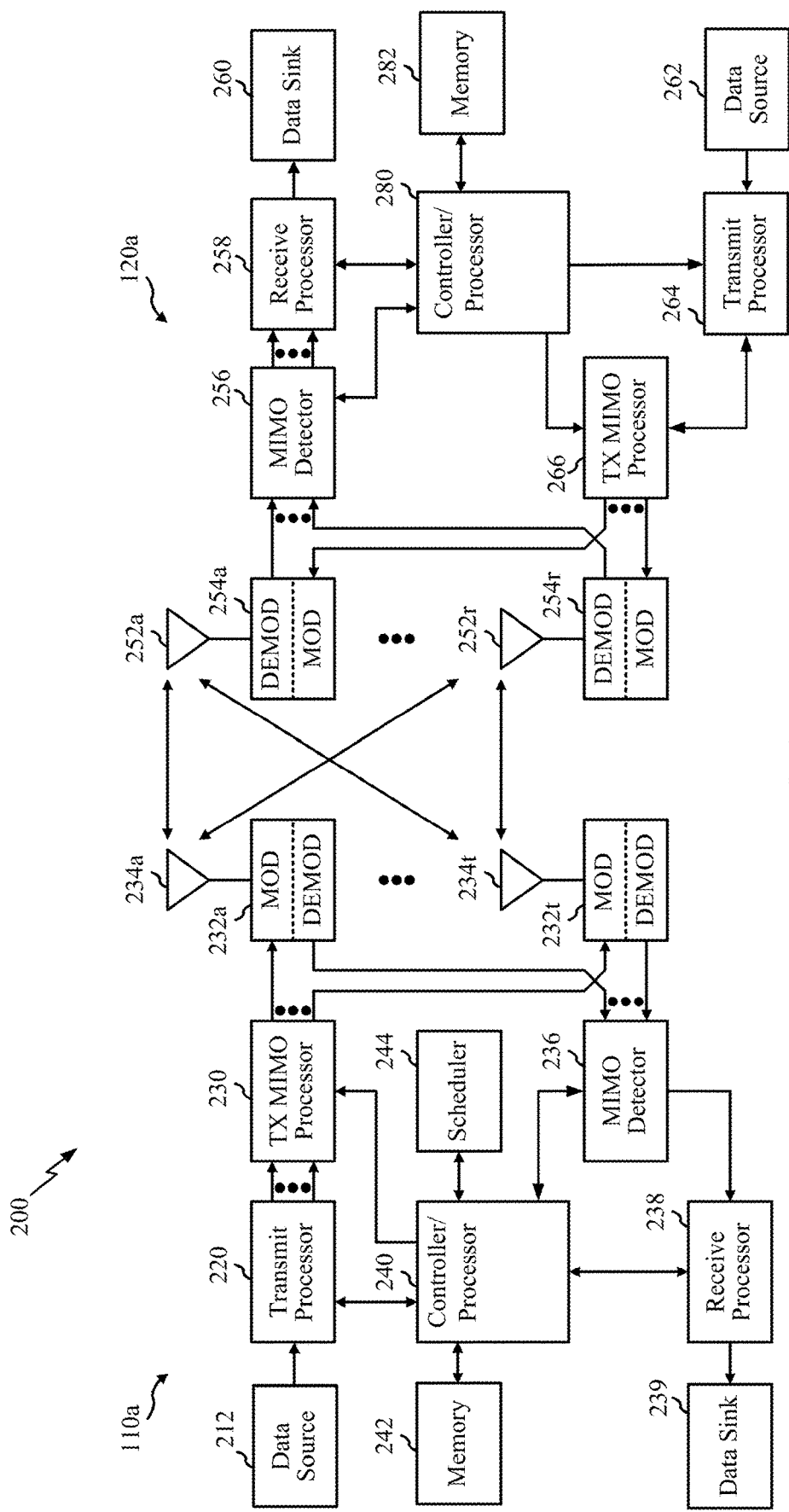
FIG. 2 is a block diagram conceptually illustrating a design of an example base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARD) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include a digital-to-analog converter (DAC) with an adjustable resistor network, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Introduction to mmWave Wireless Communications

In wireless communications, an electromagnetic spectrum is often subdivided into various classes, bands, channels, or other features. The subdivision is often provided based on wavelength or frequency, where frequency may also be referred to as a carrier, a subcarrier, a frequency channel, a tone, or a subband.

5G networks may utilize several frequency ranges, which in some cases are defined by a standard, such as the $3^{rd}$ Generation Partnership Project (3GPP) standards. For example, 3GPP technical standard TS 38.101 currently defines Frequency Range 1 (FR1) as including 600 MHz-6 GHz, though specific uplink and downlink allocations may fall outside of this general range. Thus, FR1 is often referred to (interchangeably) as a "Sub-6 GHz" band.

Similarly, TS 38.101 currently defines Frequency Range 2 (FR2) as including 26-41 GHz, though again specific uplink and downlink allocations may fall outside of this general range. FR2 is sometimes referred to (interchangeably) as a "millimeter wave" ("mmW" or "mmWave") band, despite being different from the extremely high frequency (EHF) band (30 GHz-300 GHz) that is identified by the International Telecommunications Union (ITU) as a "millimeter wave" band because wavelengths at these frequencies are between 1 millimeter and 10 millimeters.

Communications using mmWave/near mmWave radio frequency band (e.g., 3 GHz-300 GHz) may have higher path loss and a shorter range compared to lower frequency communications. As described above with respect to FIG. 1, a base station (e.g., base station 110) configured to communicate using mmWave/near mmWave radio frequency bands may utilize beamforming with a UE (e.g., UE 120) to improve path loss and range.

Example RF Transceiver

Figure 3A:
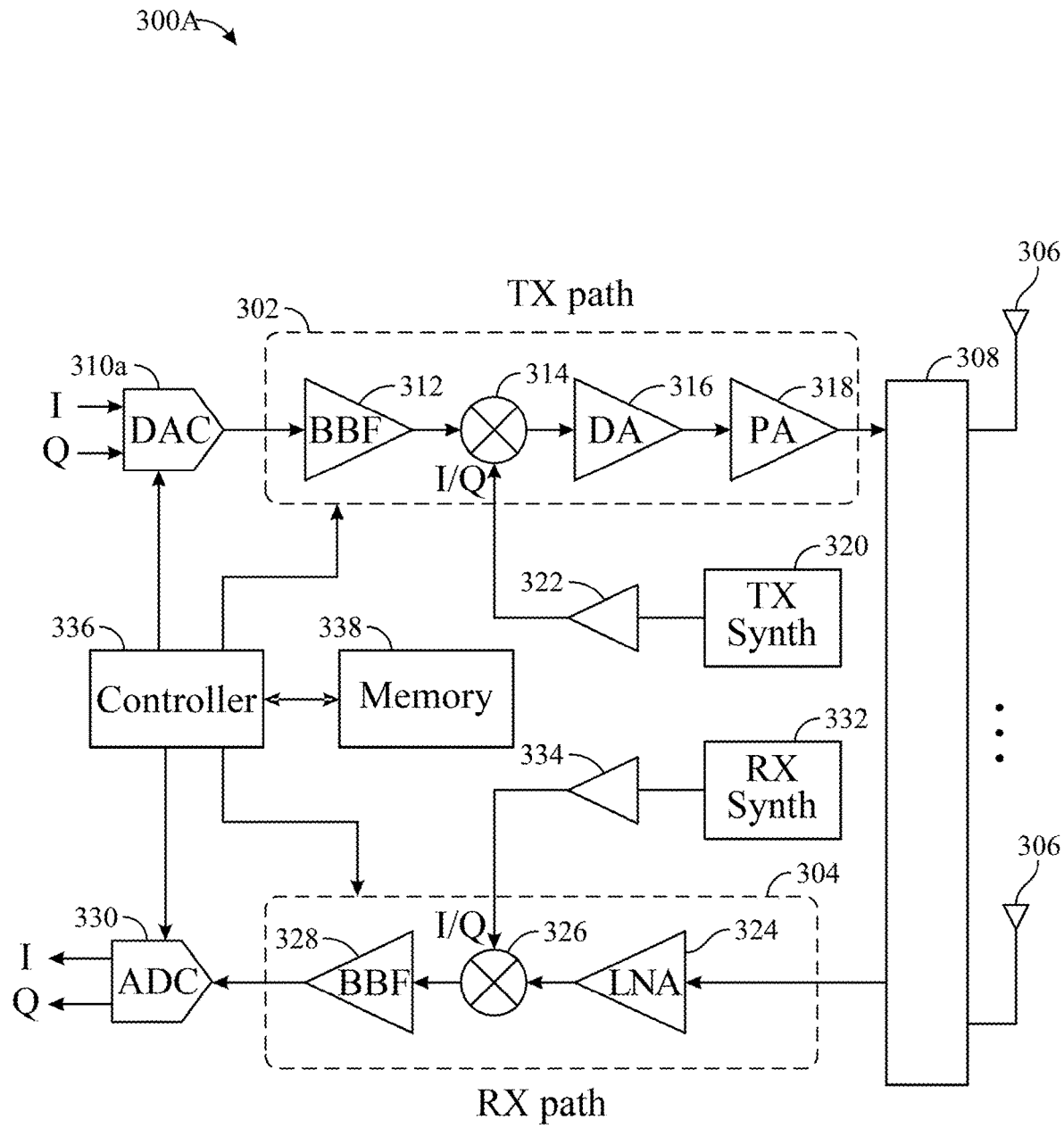
FIG. 3A is a block diagram of an example radio frequency (RF) transceiver, in which aspects of the present disclosure may be practiced.

FIG. 3A is a block diagram of an example radio frequency (RF) transceiver circuit 300A, in accordance with certain aspects of the present disclosure. The RF transceiver circuit 300A includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310a, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

For certain aspects, the DAC 310a may be implemented by any of various suitable high-speed DAC topologies, such as a current-steering DAC. For certain aspects, the DAC 310a may be implemented with an adjustable resistor network, as described in more detail below. The BBF 312 filters the baseband signals received from the DAC 310a, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300A. The controller 336 and/or the memory 338 may include control logic (e.g., complementary metal-oxide-semiconductor (CMOS) logic).

Figure 3B:
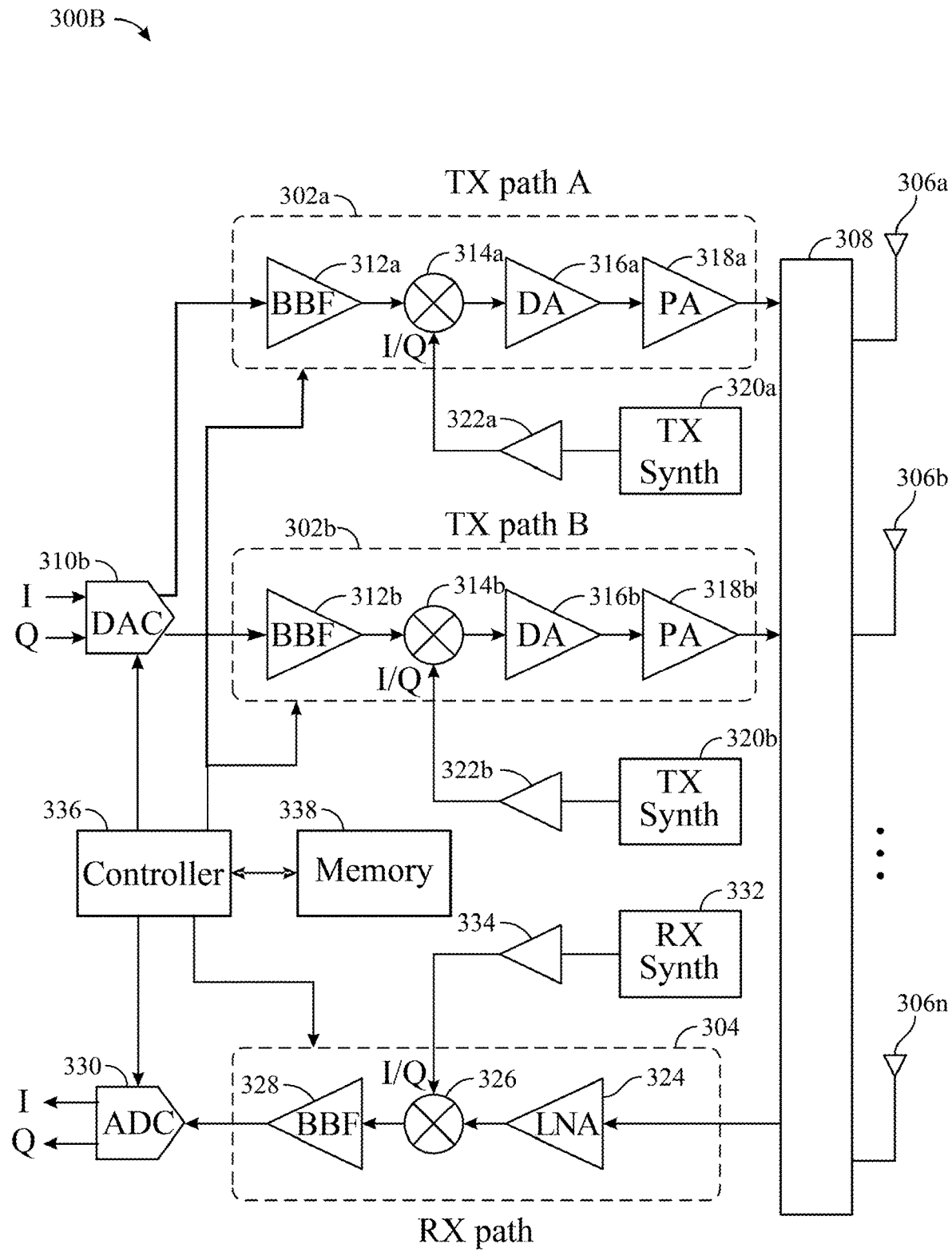
FIG. 3B is a block diagram of an example RF transceiver with multiple transmit paths, in which aspects of the present disclosure may be practiced.

FIG. 3B is a block diagram of an example RF transceiver circuit 300B, in accordance with certain aspects of the present disclosure. The RF transceiver circuit 300B may be similar to the RF transceiver circuit 300A, but with multiple TX paths 302a and 302b (collectively referred to as "TX paths 302"). The TX path 302a may include a baseband filter (BBF) 312a, a mixer 314a, a driver amplifier (DA) 316a, and a power amplifier (PA) 318a. The TX path 302b may include similar components as the TX path 302a (e.g., a BBF 312b, a mixer 314b, a DA 316b, and a PA 318b). The components of the TX path 302a may be the same as or different than the components of the TX path 302b. The RF transceiver circuit 300B may also include a DAC 310b for supporting multiple radio access technologies (RATs), such as sub-6 GHz and mmWave transmissions.

The RF transceiver circuit 300B (and more specifically, the DAC 310b and TX paths 302) may support multiple radio transmission scenarios, such as for sub-6 GHz and millimeter wave (mmWave) radio transmission scenarios. For example, the RF transceiver circuit 300B may transmit signals using a first wireless communication technology operating at or below 6 GHz (e.g., 3G, 4G, 5G, etc.) and a second wireless communication technology operating above 6 GHz (e.g., mmWave 5G NR in 24 to 60 GHz bands, IEEE 802.11ad or 802.11ay). In one example, the RF transceiver circuit 300B may process sub-6 GHz signals through the TX path 302a, and may process mmWave signals through the TX path 302b (or vice versa). As used herein, sub-6 GHz bands may include frequency bands of 300 to 6000 MHz in some examples, and may include bands in the 6000 MHz and/or 7000 MHz range in some examples.

In some cases where the DAC 310b supports both sub-6 GHz and mmWave frequency ranges and utilizes a current-steering DAC topology, the DAC 310b may be referred to as a "converged current-steering DAC." In converged current-steering DACs, a wide range of full-scale current ($I_{FS}$) is desirable due to different $I_{FS}$ specifications for baseband filters at the different outputs of the DAC 310b (e.g., BBF 312a and 312b). In some examples, the DAC 310b supports an $I_{FS}$ equal to a base value (e.g., x or 1×) for sub-6 GHz technology, and an $I_{FS}$ equal to two to four times the base value (e.g., 2× or 4×) for mmWave technology. In some examples, an $I_{FS}$ equal to eight times the base value (e.g., 8×) may be desirable. For example, if an $I_{FS}$ has a base value 1×=0.25 mA for sub-6 GHz, the $I_{FS}$ may equal be equal to 0.50 or 1.00 mA for mmWave. Although shown as single-ended outputs, each output of the DAC 310b illustrated in FIG. 3B may represent a differential output current.

While FIGS. 1, 2, 3A, and 3B provide a wireless communication as an example application in which certain aspects of the present disclosure may be implemented to facilitate understanding, certain aspects described herein may be used for digital-to-analog conversion in any of various other suitable systems (e.g., an audio system or other electronic system).

Example DAC with Adaptive Resistor Network

Current-steering digital-to-analog converters (DACs) are one example architecture for high performance digital-to-analog conversion in many wireless transmitters. One type of current-steering DAC is a resistor degeneration (R-deg) current-steering DAC. Compared to some other DAC architectures, R-deg current-steering DACs may offer reduced flicker noise, mismatch drift over temperature changes, gate leakage, and lateral area (e.g., footprint).

Figure 4A:
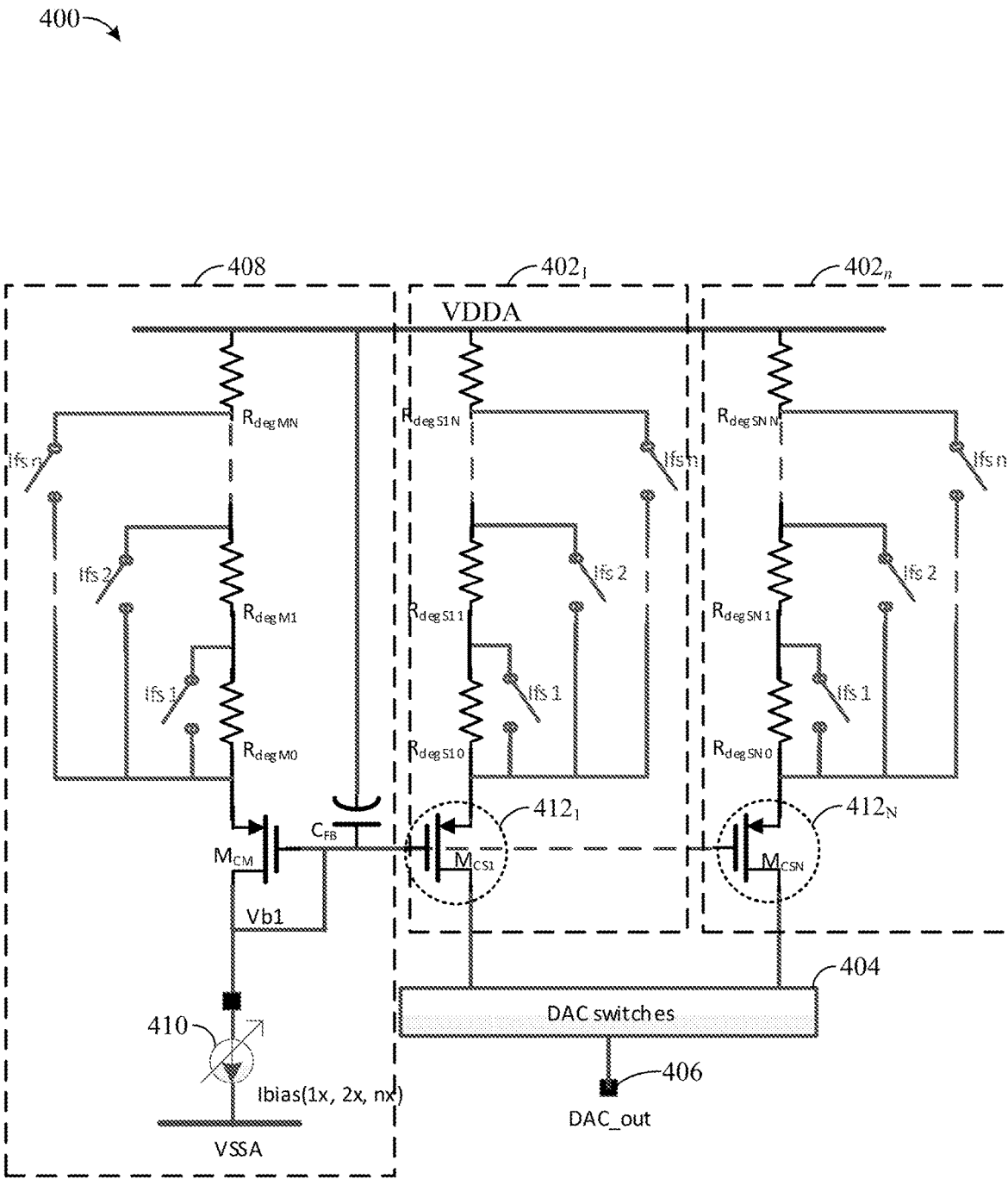
FIG. 4A is a schematic diagram of an example digital-to-analog converter (DAC) with a resistor network having an adjustable resistance, in accordance with certain aspects of the present disclosure.

FIG. 4A illustrates an example DAC 400 (e.g., which may implement the DAC 310a of FIG. 3A or DAC 310b of FIG. 3B). The core of the DAC 400 includes a number n of DAC cells $402_1$ through $402_n$ (referred to collectively as "DAC cells 402" and individually as a "DAC cell 402"), where n is an integer greater than one. Each DAC cell 402 may include at least one current source $412_1, \ldots, 412_N$ (referred to collectively as "current sources 412" and individually as a "current source 412") and a resistor network coupled between a power supply rail (e.g., VDDA) and the current source, thereby providing a degeneration resistance.

Each of the resistor networks may include a plurality of resistive elements. For example, the DAC cell $402_1$ includes N+1 degeneration resistive elements $R_{degS10}$, $R_{degS11}$, $R_{degS1N}$, and the DAC cell $402_n$ includes N+1 degeneration resistive elements $R_{degSN0}$, $R_{degSN1}$, $R_{degSNN}$. For ease of description, the resistive elements of a resistor network may be referred to collectively as "resistive elements $R_{deg}$" or individually as "a resistive element $R_{deg}$." As shown, in certain aspects, the resistive elements $R_{deg}$ of a DAC cell 402 may be coupled in series. In some examples, the nodes between the resistive elements $R_{deg}$ may be referred to as "taps" of the resistor network.

Each of the current sources 412 may be implemented by at least one transistor (e.g., transistors $M_{CS1}, \ldots, M_{CSN}$; collectively referred to as "transistors $M_{CS}$"), such as a p-type metal-oxide-semiconductor (PMOS) transistor as illustrated in FIG. 4A.

The DAC 400 may also include a plurality of DAC switches 404 coupled between the current sources 412 and an output 406 (labeled "DAC_out") of the DAC 400. Depending on a digital input signal provided to an input of the DAC 400, each bit of the DAC 400 associated with a DAC cell 402 may control that respective cell's switch 404 (or that respective cell's differential switches) to source or block a current from the cell's current source 412 to the DAC output 406. The sourced currents from the individual DAC cells 402 may be combined (e.g., using current summation) to provide the analog output signal at the DAC output 406. The DAC output 406 may be coupled to one or more baseband filters (e.g., the BBF(s) 312 of FIG. 3A or 3B) or any of various other suitable circuits. Although shown as a single-ended output in FIG. 4A, the DAC output 406 may be implemented as a pair of differential current outputs.

The DAC 400 may also include a bias branch 408 (also referred to as a "reference branch" of a current mirror, where the bias branch 408 has a reference current source and where the current sources 412 in the DAC cells 402 are controlled based on the reference current). The bias branch 408 may be configured to control the current of the current source(s) 412 in the one or more DAC cells 402. The bias branch 408 may include a replica DAC cell with a current mirror transistor $M_{CM}$ and a resistor network coupled between the power supply rail and the current mirror transistor $M_{CM}$. The bias branch 408 may also include a tunable bias current source 410 (for generating a bias current Ibias) coupled between a drain (shorted to a gate) of transistor $M_{CM}$ (and control inputs of the current sources 412 (e.g., gates of the transistors $M_{CS}$) in the one or more of the DAC cells 402) and a reference potential node (e.g., an analog ground, labeled "VSSA" in FIG. 4A). The bias current source 410 may be configured to generate a bias current with a value equal to a base value (e.g., 1×) or a multiple of the base value (e.g., 2×, 3×, 4×, n×). The bias branch 408 may also include a capacitive element (labeled "$C_{FB}$") coupled between the power supply rail (VDDA) and the control input of transistor $M_{CM}$ (and the control inputs of the current sources 412 in the one or more of the DAC cells 402). This capacitive element $C_{FB}$ may provide noise filtering, for example.

The degeneration voltage of a DAC cell 402 may be defined as the voltage drop (e.g., current-resistance (IR) drop) across the resistor network (e.g., between the power supply rail (VDDA) and the current source 412). The full-scale current ($I_{FS}$) of the DAC 400 may be defined as the sum of the currents generated by the current sources 412. The $I_{FS}$ may be controlled by the bias current source 410. The size of the current sources 412 may be selected based on a maximum $I_{FS}$ of the DAC 400. When the DAC 400 operates at the maximum $I_{FS}$, the degeneration voltage is also at a maximum value. However, when the DAC 400 operates at a nominal $I_{FS}$ (for example, less than one-half of the maximum $I_{FS}$), the degeneration voltage of the DAC cells 402 will be reduced. Current noise and mismatch are inversely proportional to the degeneration voltage of the DAC cells 402. Accordingly, as a result of the lower degeneration voltage, the DAC 400 may suffer from increased noise and mismatch. Moreover, it may be difficult to scale up the $I_{FS}$ in traditional current-steering DAC architectures since the degeneration voltage of a DAC cell 402 is scaled linearly with the current generated by the current source 412 in that DAC cell 402 and the power supply rail voltage may be limited.

Accordingly, what is needed are apparatus and techniques for maintaining the degeneration voltage at (or at least near) the maximum value, even when the DAC operates at a nominal $I_{FS}$. Certain aspects of the present disclosure provide techniques and circuitry for adaptively adjusting a resistance of the resistor network in the DAC based on the bias current. With the adjustable resistance, the degeneration voltage may be maximized (or at least increased) for a given value of the bias current (and a given headroom). The higher degeneration voltage may provide reduced output noise and mismatch.

Therefore, FIG. 4A also illustrates an example implementation of a resistor network with an adjustable resistance for use in the DAC 400, in accordance with certain aspects of the present disclosure. This implementation introduces a plurality of switches coupled to one or more of the resistive elements and configured to adjust the resistance of the resistor network, based on $I_{FS}$ for that particular DAC cell 402 (as set by the bias current).

The resistive elements $R_{deg}$ of the resistor network may be coupled in series, and taps of the resistor network may be located at the nodes between the resistive elements $R_{deg}$. As shown in FIG. 4A, a first switch Ifs1 in the plurality of switches may be coupled between a first tap of the resistor network (e.g., the node between $R_{degS10}$ and $R_{degS11}$) and the current source 412 of the DAC cell 402. In certain aspects, a second switch Ifs2 in the plurality of switches may be coupled between a second tap of the resistor network, different from the first tap, and the current source 412. For example, the second switch Ifs2 may be coupled between a second tap (e.g., the node between $R_{degS11}$ and another resistive element (not shown)) of the resistor network and the current source 412.

For certain aspects, at least one of the plurality of switches may be configured to be in an open state or a closed state based on a value of the bias current, as explained in more detail below.

Figure 4B:
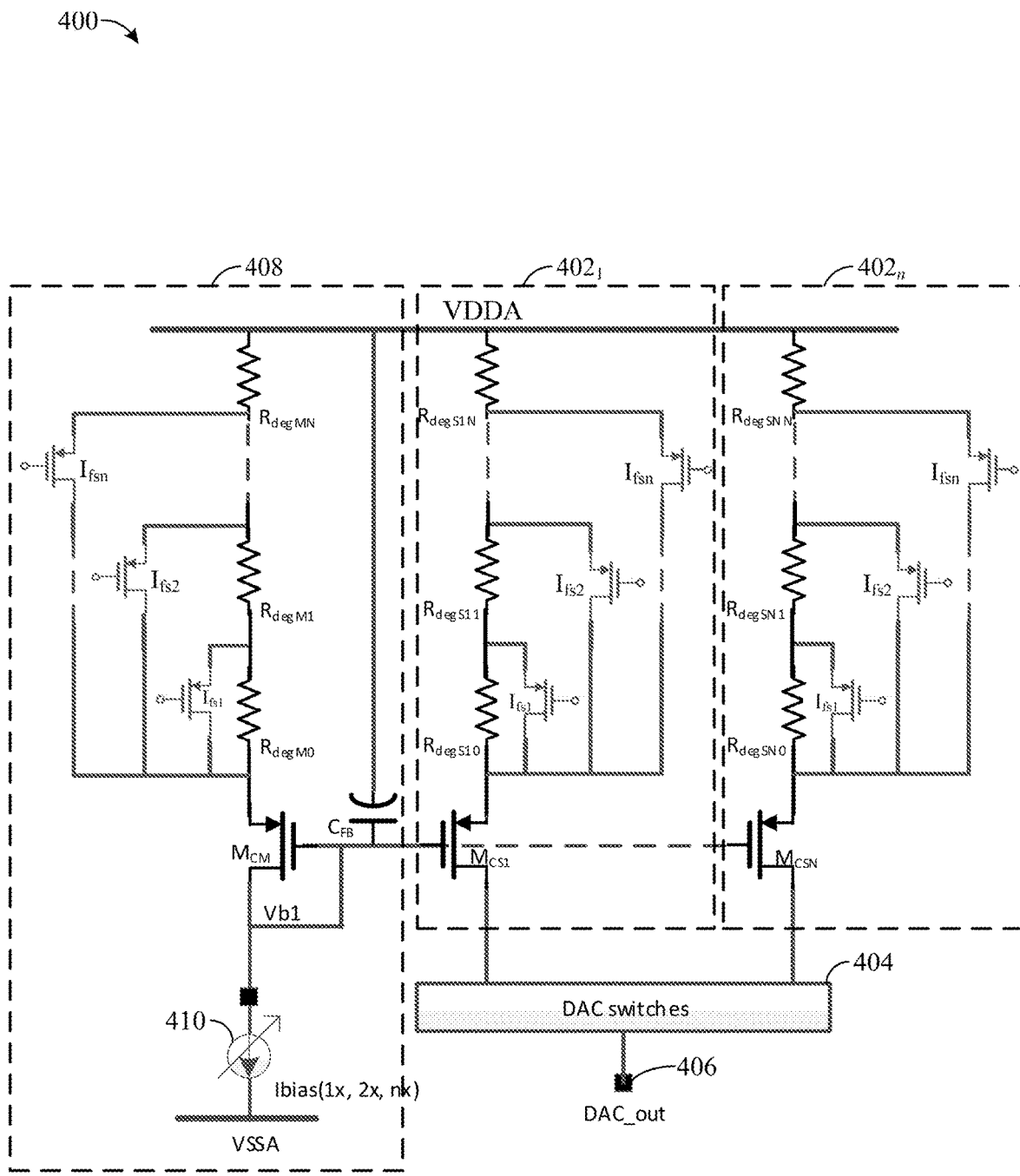
FIG. 4B is an example implementation of the DAC of FIG. 4A, in accordance with certain aspects of the present disclosure.

As shown in FIG. 4B, each of the switches may be implemented by a transistor, such as a p-channel field-effect transistor (PFET) with a negative gate-to-source voltage ($V_{gs}$). A PFET with a negative $V_{gs}$ may have low current leakage when the transistor is off. The source of each network transistor in a DAC cell 402 may be coupled to different taps of the resistor network (e.g., nodes between the resistive elements) of the respective DAC cell 402. Additionally, the drain of each network transistor in a DAC cell 402 may be coupled to the current source 412 (e.g., the source of transistor $M_{CS}$) of the respective DAC cell 402.

FIGS. 5A, 5B, 5C, and 5D are schematic diagrams illustrating alternative example circuits for implementing a resistor network with an adjustable resistance, in accordance with certain aspects of the present disclosure. For certain aspects, the resistive elements in these example circuits may have the same resistance.

As shown in circuit 500A of FIG. 5A, the resistor network may be implemented by four resistive elements (labeled $R_{deg1}$, $R_{deg2}$, $R_{deg3}$, and $R_{deg4}$) coupled in series. The resistor network may be used to support a full-scale current for a particular DAC cell, where the full-scale current may be equal to one times, two times, or four times the base value (e.g., 1×, 2×, or 4×) of the bias current (Ibias). As shown, a first switch Ifs1 may be coupled between a first tap 502 (e.g., the node between resistive elements $R_{deg2}$ and $R_{deg3}$) of the resistor network and the power supply rail (e.g., VDDA), as depicted. IMSB is the most significant bit (MSB) current, which is basically the current output by the current source for that DAC cell. In some examples, the circuit 500A may also include a second switch Ifs2 coupled between a second tap 504 (e.g., the node between resistive elements $R_{deg3}$ and $R_{deg4}$) of the resistor network and the power supply rail.

In some examples, when the bias current is set to a value equal to the base value (e.g., 1×), the first switch Ifs1 and the second switch Ifs2 may be configured to be in an open state. In some examples, when the bias current is set to a value equal to two times the base value (e.g., 2×), the first switch Ifs1 may be configured to be in a closed state, and the second switch Ifs2 may be configured to be in an open state. In some examples, when the bias current is set to a value equal to four times the base value (e.g., 4×), the second switch Ifs2 may be configured to be in a closed state, and the first switch Ifs1 may be configured to be in an open state.

In the alternative circuit 500B of FIG. 5B, for example, a first portion of the plurality of resistive elements (e.g., $R_{deg1}$ and $R_{deg2}$ coupled in series) may be selectively coupled, by a first switch Ifs1 in the plurality of switches, to a second portion of the plurality of resistive elements (e.g., $R_{deg3}$ and $R_{deg4}$ coupled in series). In other words, the first switch Ifs1 selectively couples a terminal of resistive element $R_{deg2}$ to a terminal of resistive element $R_{deg3}$. In some examples, a second switch Ifs2 may be coupled between a first tap 506 of the resistor network (the terminal of resistive element $R_{deg2}$) and the source of transistor $M_{CS}$, as shown. In some examples, a third switch Ifs3 may be coupled between a second tap 508 of the resistor network (the terminal of resistive element $R_{deg3}$) and the power supply rail, as shown.

In certain aspects, when the bias current is set to a value equal to the base value (e.g., 1×), the first switch Ifs1 may be configured to be in a closed state, and the second switch Ifs2 and the third switch Ifs3 may be configured to be in an open state. In certain aspects, when the bias current is set to a value equal to two times the base value (e.g., 2×), the first switch Ifs1 and the second switch Ifs2 may be configured to be in a closed state, and the third switch Ifs3 may be configured to be in an open state. In some examples, when the bias current is set to a value equal to four times the base value (e.g., 4×), the second switch Ifs2 and the third switch Ifs3 may be configured to be in a closed state, and the first switch Ifs1 may be configured to be in an open state (as indicated by the label "$\overline{4\times}$").

Figures 5C, 5D:
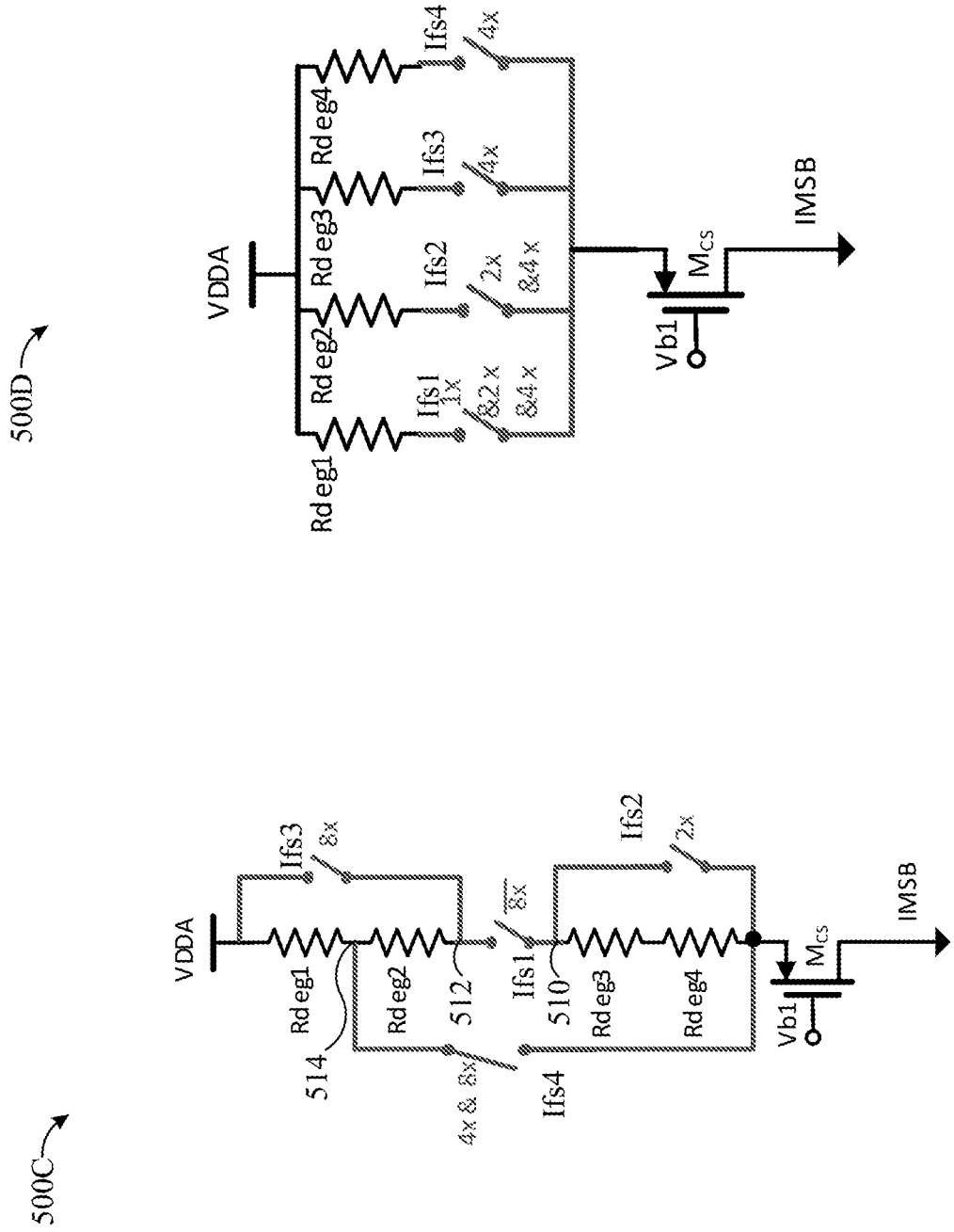

In the alternative circuit 500C of FIG. 5C, for example, a first portion of the plurality of resistive elements (e.g., $R_{deg1}$ and $R_{deg2}$ coupled in series) may be selectively coupled, by a first switch Ifs1 in the plurality of switches, to a second portion of the plurality of resistive elements (e.g., $R_{deg3}$ and $R_{deg4}$ coupled in series). In other words, the first switch Ifs1 selectively couples a terminal of resistive element $R_{deg2}$ to a terminal of resistive element $R_{deg3}$. In some examples, the alternative circuit 500C may also include a second switch Ifs2 coupled between a first tap 510 of the resistor network (the terminal of resistive element $R_{deg3}$) and the source of transistor $M_{CS}$, as shown. In some examples, the alternative circuit 500C may also include a third switch Ifs3 coupled between a second tap 512 of the resistor network (the terminal of resistive element $R_{deg2}$) and the power supply rail, as shown. In some examples, the alternative circuit 500C may also include a fourth switch Ifs4 coupled between a third tap 514 of the resistor network (a terminal of resistive element $R_{deg1}$) and the source of transistor $M_{CS}$, as shown.

In certain aspects, when the bias current is set to a value equal to the base value (e.g., 1×), the first switch Ifs1 may be configured to be in a closed state, and the second switch Ifs2, the third switch Ifs3, and the fourth switch Ifs4 may be configured to be in an open state. In certain aspects, when the bias current is set to a value equal to two times the base value (e.g., 2×), the first switch Ifs1 and the second switch Ifs2 may be configured to be in a closed state, and the third switch Ifs3 and the fourth switch Ifs4 may be configured to be in an open state. In some examples, when the bias current is set to a value equal to four times the base value (e.g., 4×), the first switch Ifs1 and the fourth switch Ifs4 may be configured to be in a closed state, and the second switch Ifs2 and the third switch Ifs3 may be configured to be in an open state. In some examples, when the bias current is set to a value equal to eight times the base value (e.g., 8×), the third switch Ifs3 and the fourth switch Ifs4 may be configured to be in a closed state, the first switch Ifs1 may be configured to be in an open state (as indicated by the label "$\overline{8\times}$") and the second switch Ifs2 may also be configured to be in an open state.

In certain aspects, each of the switches in the plurality of switches may be coupled between the current source (e.g., the source of transistor $M_{CS}$) and a different resistive element of the plurality of resistive elements, which are selectively coupled in parallel. For example, the alternative circuit 500D of FIG. 5D may include a first switch Ifs1 coupled between a first resistive element $R_{deg1}$ and the current source. In some examples, the alternative circuit 500D may also include a second switch Ifs2 coupled between a second resistive element $R_{deg2}$ and the current source. In some examples, the alternative circuit 500D may also include a third switch Ifs3 coupled between a third resistive element $R_{deg3}$ and the current source, and a fourth switch Ifs4 coupled between a fourth resistive element $R_{deg4}$ and the current source.

In the case of the alternative circuit 500D, when a set of switches are in a closed state, the resistive elements coupled to the set of switches will be coupled in parallel with each other. In certain aspects, when the bias current is set to a value equal to the base value (e.g., 1×), the first switch Ifs1 may be configured to be in a closed state, and the second, third, and fourth switches may be configured to be in an open state. In certain aspects, when the bias current is set to a value equal to two times the base value (e.g., 2×), the first switch Ifs1 and the second switch Ifs2 may be configured to be in a closed state, and the third switch Ifs3 and the fourth switch Ifs4 may be configured to be in an open state. In some examples, when the bias current is set to a value equal to four times the base value (e.g., 4×), all of the switches Ifs1-Ifs4 may be configured to be in a closed state. In this manner, if all four resistive elements have the same resistance, the degeneration voltage Vdeg will be the same in all three configurations (depending on resistor tolerance).

Although a specific number of resistive elements and switches are illustrated in FIGS. 5A-5D, it should be understood that more or fewer resistive elements and/or switches may be used.

Aspects of the present disclosure may offer reduced output noise and/or lower mismatch compared to some other DAC architectures.

Example Conversion Operations

Figure 6:
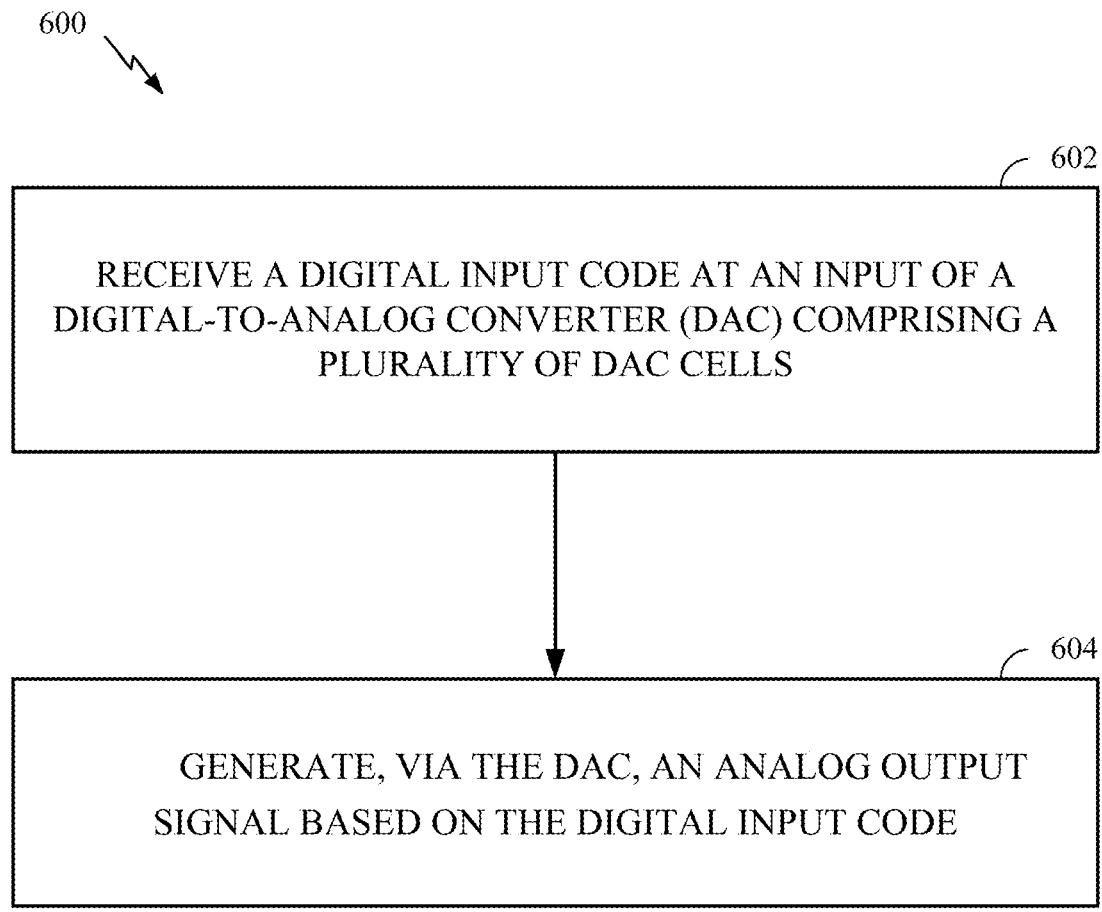
FIG. 6 is a flow diagram of example operations for digital-to-analog conversion, in accordance with certain aspects of the present disclosure.

FIG. 6 is a flow diagram of example operations 600 for digital-to-analog conversion, in accordance with certain aspects of the present disclosure. The operations 600 may be performed, for example, by a digital-to-analog converter (DAC) with a resistor network having an adjustable resistance (e.g., DAC 400).

The operations 600 may begin, at block 602, by receiving a digital input code at an input of a DAC, which includes a plurality of DAC cells (e.g., DAC cells 402). One or more of the DAC cells may include a current source (e.g., current source 412) and a resistor network (e.g., resistor networks in circuits 500A, 500B, 500C, and 500D) comprising a plurality of resistive elements (e.g., resistive elements $R_{deg1}$, $R_{deg2}$, $R_{deg3}$, and $R_{deg1}$). The resistor network may have an adjustable resistance and may be coupled between a power supply rail (e.g., VDDA) and the current source. At block 604, the DAC may generate an analog output signal based on the digital input code.

According to certain aspects, the operations 600 further involve adjusting the resistance of the resistor network in the one or more of the DAC cells. This adjusting may include selectively closing a plurality of switches (e.g., switches Ifs1— Ifs4) in the one or more of the DAC cells. The plurality of switches may be coupled to one or more of the resistive elements. For certain aspects, the operations 600 may further include tuning a bias current (e.g., Ibias) via a tunable bias current source (e.g., tunable bias current source 410) and controlling a current of the current source in the one or more of the DAC cells, based on the bias current. For certain aspects, adjusting the resistance of the resistor network in the one or more of the DAC cells involves controlling a state of at least one of the plurality of switches based on a value of the bias current (e.g., an open state or a closed state).

According to certain aspects, the resistive elements (in the plurality of resistive elements) are coupled in series; nodes between the resistive elements are taps of the resistor network; a first switch (e.g., switch Ifs1) in the plurality of switches is coupled between a first tap of the resistor network and the current source; and a second switch (e.g., switch Ifs2) in the plurality of switches is coupled between a second tap of the resistor network and the current source, the second tap being different than the first tap. In this case, controlling the state of the at least one of the plurality of switches may involve closing the first switch and opening the second switch when the value of the bias current is set at a base value; and opening the first switch and closing the second switch when the value of the bias current is set at a different value than the base value. For example, controlling the state of the at least one of the plurality of switches may include opening the first switch and closing the second switch when the value of the bias current is set at two times the base value.

According to certain aspects, the resistive elements (in the plurality of resistive elements) are coupled in series, nodes between the resistive elements are taps (e.g., taps 502, 504) of the resistor network, and a first switch (e.g., switch Ifs1)

in the plurality of switches is coupled between a first tap (e.g., tap 502) of the resistor network and the power supply rail. In this case, controlling the state of the at least one of the plurality of switches may involve opening the first switch when the value of the bias current is set at a base value and closing the first switch when the value of the bias current is set at a different value than the base value. For certain aspects, a second switch (e.g., switch Ifs2) in the plurality of switches is coupled between a second tap (e.g., tap 504) of the resistor network and the power supply rail, the second tap being different than the first tap. In this case, controlling the state of the at least one of the plurality of switches may include opening the first switch and the second switch when the value of the bias current is set at a base value, closing the first switch and opening the second switch when the value of the bias current is set at two times the base value, and opening the first switch and closing the second switch when the value of the bias current is set at four times the base value.

According to certain aspects, a first portion of the plurality of resistive elements (e.g., resistive elements Rdeg1 and Rdeg2) is selectively coupled, by a first switch (e.g., switch Ifs1 in FIG. 5B or 5C) in the plurality of switches, to a second portion of the plurality of resistive elements (e.g., resistive elements Rdeg3 and Rdeg4), and a second switch (e.g., switch Ifs2 in FIG. 5B or 5C) in the plurality of switches is coupled between a first tap (e.g., tap 506 in FIG. 5B or tap 510 in FIG. 5C) of the resistor network and the current source. In this case, controlling the state of the at least one of the plurality of switches may involve closing the first switch and opening the second switch when the value of the bias current is set at a base value, and closing the first switch and the second switch when the value of the bias current is set at a different value than the base value. For certain aspects, a third switch (e.g., switch Ifs3 in FIG. 5B) in the plurality of switches is coupled between a second tap (e.g., tap 508 in FIG. 5B) of the resistor network and the power supply rail, the second tap being different than the first tap. In this case, closing the first switch and the second switch may include closing the first switch and the second switch when the value of the bias current is set at two times the base value, and controlling the state of the at least one of the plurality of switches may further involve opening the first switch and closing the second switch and the third switch when the value of the bias current is set at four times the base value. For other aspects, a third switch (e.g., switch Ifs4 in FIG. 5C) in the plurality of switches is coupled between a second tap (e.g., tap 514 in FIG. 5C) of the resistor network and the current source, the second tap being different than the first tap. In this case, closing the first switch and the second switch may include closing the first switch and the second switch when the value of the bias current is set at two times the base value, and controlling the state of the at least one of the plurality of switches may further involve closing the first switch and the third switch and opening the second switch when the value of the bias current is set at four times the base value. For certain aspects, a fourth switch (e.g., switch Ifs3 in FIG. 5C) in the plurality of switches is coupled between a third tap (e.g., tap 512) of the resistor network and the power supply rail, the third tap being different than the first tap and the second tap. In this case, controlling the state of the at least one of the plurality of switches may further involve opening the first switch and the second switch and closing the third switch and the fourth switch when the value of the bias current is set at eight times the base value.

According to certain aspects, a first switch (e.g., switch Ifs 1 in FIG. 5D) in the plurality of switches is coupled in series with a first resistive element (e.g., resistive element Rdeg1), between the power supply rail and the current source, and a second switch (e.g., switch Ifs2 in FIG. 5D) in the plurality of switches is coupled in series with a second resistive element (e.g., resistive element Rdeg2), between the power supply rail and the current source. In this case, controlling the state of the at least one of the plurality of switches may involve closing the first switch and opening the second switch when the value of the bias current is set at a base value, and closing the first switch and the second switch when the value of the bias current is set at a different value than the base value, such that the first resistive element and the second resistive element are coupled in parallel. For certain aspects, a third switch (e.g., switch Ifs3 in FIG. 5D) in the plurality of switches is coupled in series with a third resistive element (e.g., resistive element Rdeg3), between the power supply rail and the current source, and a fourth switch (e.g., switch Ifs4 in FIG. 5D) in the plurality of switches is coupled in series with a fourth resistive element (e.g., resistive element Rdeg3), between the power supply rail and the current source. In this case, controlling the state of the at least one of the plurality of switches may further involve closing the first switch and the second switch and opening the third switch and the fourth switch when the value of the bias current is set at two times the base value, and closing the first switch, the second switch, the third switch, and the fourth switch when the value of the bias current is set at four times the base value.

Example Aspects

In addition to the various aspects described above, specific combinations of aspects are within the scope of the present disclosure, some of which are detailed below:

Aspect 1: A digital-to-analog converter (DAC) comprising a plurality of DAC cells, wherein one or more of the DAC cells comprise: a current source; and a resistor network comprising a plurality of resistive elements, having an adjustable resistance, and coupled between a power supply rail and the current source.

Aspect 2: The DAC of Aspect 1, wherein the one or more of the DAC cells further comprise a plurality of switches coupled to one or more of the resistive elements and configured to adjust the resistance of the resistor network.

Aspect 3: The DAC of Aspect 1 or 2, further comprising a tunable bias current source configured to generate a bias current and coupled between a control input of the current source in the one or more of the DAC cells and a reference potential node for the DAC.

Aspect 4: The DAC of Aspect 3, wherein at least one of the plurality of switches is configured to be in an open state or a closed state, based on a value of the bias current.

Aspect 5: The DAC of any of Aspects 2-4, wherein one or more of the plurality of switches comprise a p-channel field-effect transistor (PFET) having a negative gate-to-source voltage ($V_{gs}$).

Aspect 6: The DAC of any of the preceding Aspects, wherein: the plurality of resistive elements are coupled in series; and nodes between the resistive elements comprise taps of the resistor network.

Aspect 7: The DAC of any of Aspects 2-6, wherein a first switch in the plurality of switches is coupled between a first tap of the resistor network and the current source.

Aspect 8: The DAC of Aspect 7, wherein a second switch in the plurality of switches is coupled between a second tap of the resistor network and the current source, the second tap being different than the first tap.

Aspect 9: The DAC of any of Aspects 2-6, wherein a first switch in the plurality of switches is coupled between a first tap of the resistor network and the power supply rail.

Aspect 10: The DAC of Aspect 9, wherein a second switch in the plurality of switches is coupled between a second tap of the resistor network and the power supply rail, the second tap being different than the first tap.

Aspect 11: The DAC of any of Aspects 2-6, wherein: a first portion of the plurality of resistive elements is selectively coupled, by a first switch in the plurality of switches, to a second portion of the plurality of resistive elements; and a second switch in the plurality of switches is coupled between a first tap of the resistor network and the current source.

Aspect 12: The DAC of Aspect 11, wherein a third switch in the plurality of switches is coupled between a second tap of the resistor network and the power supply rail, the second tap being different than the first tap.

Aspect 13: The DAC of any of Aspects 2-6, wherein: a first switch in the plurality of switches is coupled in series with a first resistive element, between the power supply rail and the current source; a second switch in the plurality of switches is coupled in series with a second resistive element, between the power supply rail and the current source; and the first resistive element and the second resistive element are coupled in parallel when the first switch and the second switch are in a closed state.

Aspect 14: A wireless device comprising the DAC of any of the preceding Aspects, the wireless device further comprising: one or more antennas; and one or more transmit paths coupled between one or more outputs of the DAC and the one or more antennas.

Aspect 15: A method for digital-to-analog conversion, comprising: receiving a digital input code at an input of a digital-to-analog converter (DAC) comprising a plurality of DAC cells; and generating, via the DAC, an analog output signal based on the digital input code, wherein one or more of the plurality of DAC cells comprise: a current source; and a resistor network comprising a plurality of resistive elements, having an adjustable resistance, and coupled between a power supply rail and the current source.

Aspect 16: The method of Aspect 15, further comprising adjusting the resistance of the resistor network in the one or more of the DAC cells, the adjusting including selectively closing a plurality of switches in the one or more of the DAC cells, wherein the plurality of switches are coupled to one or more of the resistive elements.

Aspect 17: The method of Aspect 15 or 16, further comprising: tuning a bias current via a tunable bias current source; and controlling a current of the current source in the one or more of the DAC cells, based on the bias current.

Aspect 18: The method of Aspect 16 or 17, wherein adjusting the resistance of the resistor network in the one or more of the DAC cells comprises controlling a state of at least one of the plurality of switches based on a value of the bias current and wherein the state of the at least one of the plurality of switches comprises an open state or a closed state.

Aspect 19: The method of any of Aspects 16-18, wherein: the plurality of resistive elements are coupled in series; nodes between the resistive elements comprise taps of the resistor network; a first switch in the plurality of switches is coupled between a first tap of the resistor network and the current source; a second switch in the plurality of switches is coupled between a second tap of the resistor network and the current source, the second tap being different than the first tap; and controlling the state of the at least one of the plurality of switches comprises: closing the first switch and opening the second switch when the value of the bias current is set at a base value; and opening the first switch and closing the second switch when the value of the bias current is set at a different value than the base value.

Aspect 20: The method of Aspect 19, wherein controlling the state of the at least one of the plurality of switches comprises opening the first switch and closing the second switch when the value of the bias current is set at two times the base value.

Aspect 21: The method of any of Aspects 16-18, wherein: the plurality of resistive elements are coupled in series; nodes between the resistive elements comprise taps of the resistor network; a first switch in the plurality of switches is coupled between a first tap of the resistor network and the power supply rail; and controlling the state of the at least one of the plurality of switches comprises: opening the first switch when the value of the bias current is set at a base value; and closing the first switch when the value of the bias current is set at a different value than the base value.

Aspect 22: The method of Aspect 21, wherein: a second switch in the plurality of switches is coupled between a second tap of the resistor network and the power supply rail, the second tap being different than the first tap; and controlling the state of the at least one of the plurality of switches comprises: opening the first switch and the second switch when the value of the bias current is set at the base value; closing the first switch and opening the second switch when the value of the bias current is set at two times the base value; and opening the first switch and closing the second switch when the value of the bias current is set at four times the base value.

Aspect 23: The method of any of Aspects 16-18, wherein: a first portion of the plurality of resistive elements is selectively coupled, by a first switch in the plurality of switches, to a second portion of the plurality of resistive elements; a second switch in the plurality of switches is coupled between a first tap of the resistor network and the current source; and controlling the state of the at least one of the plurality of switches comprises: closing the first switch and opening the second switch when the value of the bias current is set at a base value; and closing the first switch and the second switch when the value of the bias current is set at a different value than the base value.

Aspect 24: The method of Aspect 23, wherein: a third switch in the plurality of switches is coupled between a second tap of the resistor network and the power supply rail, the second tap being different than the first tap; closing the first switch and the second switch comprises closing the first switch and the second switch when the value of the bias current is set at two times the base value; and controlling the state of the at least one of the plurality of switches further comprises opening the first switch and closing the second switch and the third switch when the value of the bias current is set at four times the base value.

Aspect 25: The method of Aspect 23, wherein: a third switch in the plurality of switches is coupled between a second tap of the resistor network and the current source, the second tap being different than the first tap; closing the first switch and the second switch comprises closing the first switch and the second switch when the value of the bias current is set at two times the base value; and controlling the state of the at least one of the plurality of switches further comprises closing the first switch and the third switch and opening the second switch when the value of the bias current is set at four times the base value.

Aspect 26: The method of Aspect 25, wherein: a fourth switch in the plurality of switches is coupled between a third tap of the resistor network and the power supply rail, the third tap being different than the first tap and the second tap; and controlling the state of the at least one of the plurality of switches further comprises opening the first switch and the second switch and closing the third switch and the fourth switch when the value of the bias current is set at eight times the base value.

Aspect 27: The method of any of Aspects 16-18, wherein: a first switch in the plurality of switches is coupled in series with a first resistive element, between the power supply rail and the current source; a second switch in the plurality of switches is coupled in series with a second resistive element, between the power supply rail and the current source; and controlling the state of the at least one of the plurality of switches comprises: closing the first switch and opening the second switch when the value of the bias current is set at a base value; and closing the first switch and the second switch when the value of the bias current is set at a different value than the base value, such that the first resistive element and the second resistive element are coupled in parallel.

Aspect 28: The method of Aspect 27, wherein: a third switch in the plurality of switches is coupled in series with a third resistive element, between the power supply rail and the current source; a fourth switch in the plurality of switches is coupled in series with a fourth resistive element, between the power supply rail and the current source; and controlling the state of the at least one of the plurality of switches further comprises: closing the first switch and the second switch and opening the third switch and the fourth switch when the value of the bias current is set at two times the base value; and closing the first switch, the second switch, the third switch, and the fourth switch when the value of the bias current is set at four times the base value.

CONCLUSION

Described herein are digital-to-analog converter (DAC) architectures to address the reduced degeneration voltage when a DAC operates at a nominal full-scale current. Certain aspects of the present disclosure provide techniques and circuitry for adaptively adjusting a resistance of a resistor network in the DAC (e.g., based on a full-scale current, which may change based on a tunable bias current). With the adjustable resistance, the degeneration voltage may be maximized (or at least increased) for a given value of the bias current. The increased degeneration voltage may provide reduced output noise and mismatch from the DAC.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A digital-to-analog converter (DAC) comprising a plurality of DAC cells, wherein one or more of the DAC cells comprise:
    a current source;
    a resistor network comprising a plurality of resistive elements, having an adjustable resistance, and coupled between a power supply rail and the current source; and
    a plurality of switches coupled to one or more of the resistive elements and configured to adjust the resistance of the resistor network, wherein one or more of the plurality of switches comprise a p-channel field-effect transistor (PFET) having a negative gate-to-source voltage $V_{gs}$).

2. The DAC of claim 1, further comprising a tunable bias current source configured to generate a bias current and coupled between a control input of the current source in the one or more of the DAC cells and a reference potential node for the DAC.

3. The DAC of claim 2, wherein at least one of the plurality of switches is configured to be in an open state or a closed state, based on a value of the bias current.

4. The DAC of claim 1, wherein:
    the plurality of resistive elements are coupled in series;
    nodes between the resistive elements comprise taps of the resistor network;
    a first switch in the plurality of switches is coupled between a first tap of the resistor network and the current source; and a second switch in the plurality of switches is coupled between a second tap of the resistor network and the current source, the second tap being different than the first tap.

5. A wireless device comprising the DAC of claim 1, the wireless device further comprising:
one or more antennas; and
one or more transmit paths coupled between one or more outputs of the DAC and the one or more antennas.

6. A digital-to-analog converter (DAC) comprising a plurality of DAC cells, wherein one or more of the DAC cells comprise:
a current source;
a resistor network comprising a plurality of resistive elements, having an adjustable resistance, and coupled between a power supply rail and the current source; and
a plurality of switches coupled to one or more of the resistive elements and configured to adjust the resistance of the resistor network, wherein the plurality of resistive elements are coupled in series, wherein nodes between the resistive elements comprise taps of the resistor network, and wherein a first switch in the plurality of switches is coupled between a first tap of the resistor network and the current source.

7. The DAC of claim 6, wherein a second switch in the plurality of switches is coupled between a second tap of the resistor network and the current source, the second tap being different than the first tap.

8. The DAC of claim 6, further comprising a tunable bias current source configured to generate a bias current and coupled between a control input of the current source in the one or more of the DAC cells and a reference potential node for the DAC.

9. The DAC of claim 8, wherein at least one of the plurality of switches is configured to be in an open state or a closed state, based on a value of the bias current.

10. A digital-to-analog converter (DAC) comprising a plurality of DAC cells, wherein one or more of the DAC cells comprise:
a current source;
a resistor network comprising a plurality of resistive elements, having an adjustable resistance, and coupled between a power supply rail and the current source; and
a plurality of switches coupled to one or more of the resistive elements and configured to adjust the resistance of the resistor network, wherein the plurality of resistive elements are coupled in series, wherein nodes between the resistive elements comprise taps of the resistor network, and wherein a first switch in the plurality of switches is coupled between a first tap of the resistor network and the power supply rail.

11. The DAC of claim 10, wherein a second switch in the plurality of switches is coupled between a second tap of the resistor network and the power supply rail, the second tap being different than the first tap.

12. The DAC of claim 10, further comprising a tunable bias current source configured to generate a bias current and coupled between a control input of the current source in the one or more of the DAC cells and a reference potential node for the DAC.

13. The DAC of claim 12, wherein at least one of the plurality of switches is configured to be in an open state or a closed state, based on a value of the bias current.

14. A digital-to-analog converter (DAC) comprising a plurality of DAC cells, wherein one or more of the DAC cells comprise:
a current source;
a resistor network comprising a plurality of resistive elements, having an adjustable resistance, and coupled between a power supply rail and the current source; and
a plurality of switches coupled to one or more of the resistive elements and configured to adjust the resistance of the resistor network, wherein:
a first portion of the plurality of resistive elements is selectively coupled, by a first switch in the plurality of switches, to a second portion of the plurality of resistive elements; and
a second switch in the plurality of switches is coupled between a first tap of the resistor network and the current source.

15. The DAC of claim 14, wherein a third switch in the plurality of switches is coupled between a second tap of the resistor network and the power supply rail, the second tap being different than the first tap.

16. The DAC of claim 14, further comprising a tunable bias current source configured to generate a bias current and coupled between a control input of the current source in the one or more of the DAC cells and a reference potential node for the DAC.

17. The DAC of claim 16, wherein at least one of the plurality of switches is configured to be in an open state or a closed state, based on a value of the bias current.

18. A digital-to-analog converter (DAC) comprising a plurality of DAC cells, wherein one or more of the DAC cells comprise:
a current source;
a resistor network comprising a plurality of resistive elements, having an adjustable resistance, and coupled between a power supply rail and the current source; and
a plurality of switches coupled to one or more of the resistive elements and configured to adjust the resistance of the resistor network, wherein:
a first switch in the plurality of switches is coupled in series with a first resistive element, between the power supply rail and the current source;
a second switch in the plurality of switches is coupled in series with a second resistive element, between the power supply rail and the current source; and
the first resistive element and the second resistive element are coupled in parallel when the first switch and the second switch are in a closed state.

19. The DAC of claim 18, further comprising a tunable bias current source configured to generate a bias current and coupled between a control input of the current source in the one or more of the DAC cells and a reference potential node for the DAC.

20. The DAC of claim 19, wherein at least one of the plurality of switches is configured to be in an open state or a closed state, based on a value of the bias current.

* * * * *